United States Patent
Oh et al.

(10) Patent No.: US 7,629,239 B2
(45) Date of Patent: Dec. 8, 2009

(54) METHOD OF FABRICATING A SEMICONDUCTOR DEVICE WITH A DOPANT REGION IN A LOWER WIRE

(75) Inventors: Jun-hwan Oh, Incheon (KR); Dong-cho Maeng, Yongin-si (KR); Soon-ho Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/336,028

(22) Filed: Dec. 16, 2008

(65) Prior Publication Data

US 2009/0098730 A1    Apr. 16, 2009

Related U.S. Application Data

(62) Division of application No. 11/591,762, filed on Nov. 2, 2006, now Pat. No. 7,482,684.

(30) Foreign Application Priority Data

Nov. 25, 2005    (KR) .................. 10-2005-0113818

(51) Int. Cl.
   *H01L 21/265* (2006.01)
   *H01L 23/48* (2006.01)

(52) U.S. Cl. .................. 438/522; 438/643; 438/660; 257/751; 257/758; 257/774; 257/E21.584

(58) Field of Classification Search .................. None
   See application file for complete search history.

(56) References Cited

U.S. PATENT DOCUMENTS

| | | | | |
|---|---|---|---|---|
| 6,100,184 | A  * | 8/2000 | Zhao et al. | 438/638 |
| 6,548,905 | B2 * | 4/2003 | Park et al. | 257/762 |
| 6,797,619 | B2 * | 9/2004 | Jang et al. | 438/685 |
| 6,884,710 | B2 * | 4/2005 | Park et al. | 438/614 |
| 7,482,684 | B2 * | 1/2009 | Oh et al.  | 257/700 |
| 2002/0109234 | A1 | 8/2002 | Park et al. | |
| 2003/0111735 | A1 | 6/2003 | Lee | |
| 2003/0160331 | A1 | 8/2003 | Fujisawa | |

FOREIGN PATENT DOCUMENTS

| | | |
|---|---|---|
| JP | 2003249547 | 9/2003 |
| KR | 10-0385227 | 5/2003 |
| KR | 10-0413828 | 12/2003 |

* cited by examiner

*Primary Examiner*—Alonzo Chambliss
(74) *Attorney, Agent, or Firm*—Mills & Onello, LLP.

(57) ABSTRACT

A semiconductor device and a method of fabricating the same are disclosed. The semiconductor device includes a lower wire, an interlayer insulating film formed on the lower wire and having a via hole exposing the upper surface of the lower wire, a diffusion barrier formed on the inner wall of the via hole, and an upper wire filling the via hole and directly contacting the lower wire, in which a dopant region containing a component of the diffusion barrier is formed in the lower wire in the extension direction of the via hole.

10 Claims, 6 Drawing Sheets

METHOD OF FABRICATING A SEMICONDUCTOR DEVICE WITH A DOPANT REGION IN A LOWER WIRE

CROSS-REFERENCE TO RELATED APPLICATION

This application is a divisional application of U.S. patent application Ser. No. 11/591,762, filed Nov. 2, 2006, now U.S. Pat. No. 7,482,684, which is based on and claims priority from Korean Patent Application No. 10-2005-0113818 filed on Nov. 25, 2005 in the Korean Intellectual Property Office, the contents of which applications are incorporated herein in their entirety by reference.

BACKGROUND OF THE INVENTION

1. Field of the Invention

The present invention relates to a semiconductor device and a method of fabricating the same and, more particularly, to a semiconductor device having highly reliable wires and a method of fabricating such a semiconductor device.

2. Description of the Related Art

With the increase in the degree of integration of a semiconductor device, the requirement for reliable wires is increasing. As wiring material of the semiconductor device, copper (Cu) has a higher melting point than aluminum (Al), and thus exhibits excellent electro-migration (EM) and stress-migration (SM) properties. As well, copper has low resistivity.

However, copper suffers because it diffuses in an insulating film formed of silicon or silicon oxide used in the semiconductor device, undesirably increasing current leakage or parasitic capacitance. With the goal of solving such a problem, a diffusion barrier is typically interposed between the copper layer and the insulating film.

In this way, the use of the diffusion barrier results in prevention of the diffusion of the copper layer. However, the diffusion barrier, having higher resistance than copper, is disadvantageously provided at the bottom of the via hole connecting the upper wire and the lower wire, leading to increased wire resistance.

In the case of forming a copper wire using a dual damascene process, due to heat stress applied to a dual damascene wire upon heat treatment process during subsequent semiconductor device fabrication processes, a huge stress-induced void (SIV) may be formed in the lower portion of the dual damascene wire. Such SIV results in poor electrical properties of the wire, deteriorating the reliability of the semiconductor device.

SUMMARY OF THE INVENTION

Accordingly, the present invention has been made keeping in mind the above problems occurring in the related art, and a feature of the present invention is to provide a semiconductor device having improved resistance properties and high reliability.

Another feature of the present invention is to provide a method of fabricating such a semiconductor device.

According to one aspect, the present invention provides a semiconductor device including a lower wire; an interlayer insulating film formed on the lower wire and having a via hole exposing the upper surface of the lower wire; a diffusion barrier formed on the inner wall of the via hole; and an upper wire filling the via hole and directly contacting the lower wire. A dopant region containing a component of the diffusion barrier is formed in the lower wire in a direction in which the via hole extends.

In one embodiment, an upper surface of the lower wire has a profile contacting a lower surface of the via hole or rising into the via hole.

In one embodiment, the lower wire and the upper wire are formed of copper or a copper alloy.

In one embodiment, the diffusion barrier is formed of TiN, Ti, Ta, TaN, TiSiN, or TaSiN.

In one embodiment, the diffusion barrier is 10~500 Å thick.

According to another aspect, the present invention provides a method of fabricating a semiconductor device, the method including forming a lower wire; forming an interlayer insulating film having a via hole exposing the upper surface of the lower wire; forming a diffusion barrier on the inner wall and lower surface of the via hole; inverting the diffusion barrier formed on the lower surface of the via hole with the lower wire adjacent thereto through heat treatment, thus forming a dopant region containing a component of the diffusion barrier in the lower wire; and forming an upper wire that fills the via hole and directly contacts the lower wire.

In one embodiment, the lower wire and the upper wire are formed of copper or a copper alloy.

In one embodiment, the forming the diffusion barrier is conducted using TiN, Ti, Ta, TaN, TiSiN, or TaSiN.

In one embodiment, the forming the diffusion barrier is conducted such that the diffusion barrier has a thickness of 10~500 Å. In one embodiment, the forming the diffusion barrier is conducted such that the diffusion barrier has a thickness of 100 Å or less on the lower surface of the via hole.

In one embodiment, the heat treatment process is conducted at 400~700° C.

In one embodiment, the heat treatment process is conducted using rapid thermal processing or a furnace process.

In one embodiment, the filling the via hole comprises forming a copper seed layer on the diffusion barrier formed on the inner wall of the via hole, and forming a copper layer through electroplating.

In one embodiment, forming the interlayer insulating film further comprises forming a trench on the via hole, forming the diffusion barrier is conducted while forming the diffusion barrier on an inner wall of the trench, and filling the via hole is conducted while filling the trench.

In one embodiment, the heat treatment process comprises exposing an upper surface of the lower wire through the via hole such that the upper surface of the lower wire has a profile contacting the lower surface of the via hole or rising into the via hole.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DESCRIPTION OF THE PREFERRED EMBODIMENTS

The advantages and features of the present invention, and the way of attaining them, will become apparent with reference to embodiments described below in conjunction with the accompanying drawings. However, the present invention is not limited to the embodiments disclosed below and will be embodied in a variety of different forms; rather, these embodiments are provided so that this disclosure will be thorough and complete, and will fully convey the scope of the present invention to those skilled in the art, and the scope of the present invention will be defined by the appended claims.

Reference now should be made to the drawings, in which the same reference numerals are used throughout the different drawings to designate the same or similar components. Further, the embodiments of the present invention are described, with reference to cross-sectional views provided as ideal illustrations of the present invention. As such, the type of illustration may vary depending on the fabrication technique and/or allowable error. Thus, the embodiments of the present invention are not limited to the specific shapes shown in the drawings but include changes in shape that depend on the fabrication process. For example, the etched region represented by a rectangular shape may be in the form of a round shape, or may have a predetermined curvature. Accordingly, regions shown in the drawings are schematically depicted, and the shapes thereof are set forth to illustrate the predetermined shapes of the regions of the device of the present invention, but are not to be construed to limit the scope of the present invention.

Figure 1:
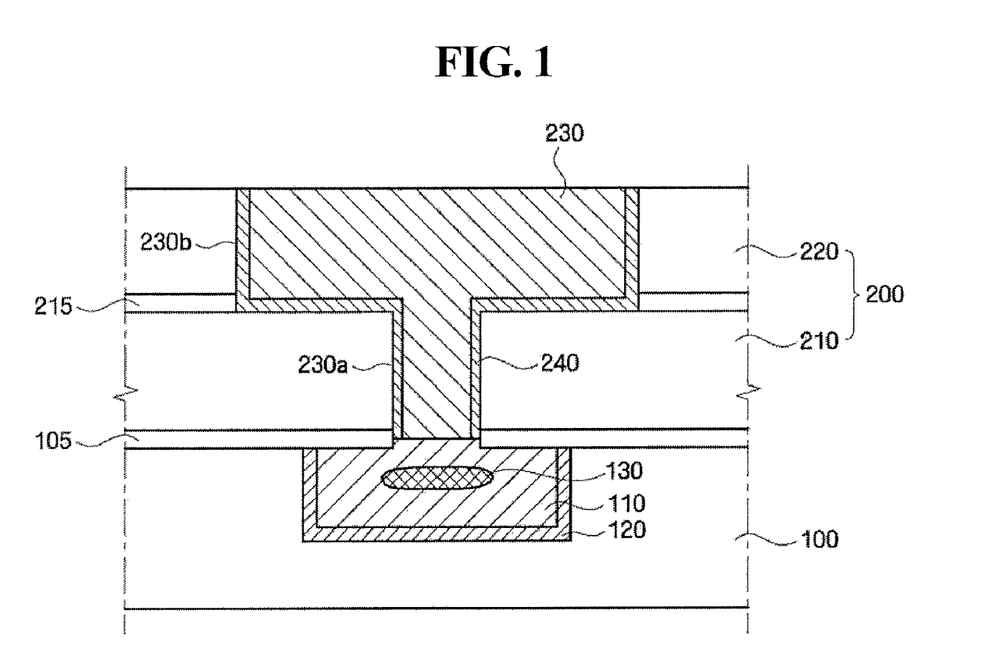
FIG. 1 is a cross-sectional view showing one embodiment of the semiconductor device of the present invention.

With reference to FIG. 1, a semiconductor device according to the present invention is described.

FIG. 1 is a cross-sectional view showing one embodiment of the semiconductor device of the present invention. As shown in FIG. 1, the semiconductor device of the present invention comprises a lower wire 110, an interlayer insulating film 200, an upper wire 230, and a diffusion barrier 240.

The lower wire 110 may be formed in a predetermined insulating film 100. As such, although not shown in the drawing, the insulating film 100 may be formed on a semiconductor substrate having fine elements. Such a lower wire 110 may be formed of copper or a copper alloy. In addition, the lower wire 110 may be surrounded by a predetermined diffusion barrier 120.

In the lower wire 110, a predetermined dopant region 130 is positioned. The dopant region 130 includes a component of a diffusion barrier 240 surrounding the upper wire 230. Specifically, the dopant region 130 may be present in the form of an intermetallic compound between the component of the diffusion barrier and the conductive material constituting the lower wire or in the form of boundary segregation. In this way, when the dopant region 130 is provided, the generation of SIV (Stress-Induced Void), which may be generally formed near the interface of the lower wire contacting the via hole, may be minimized. Such a dopant region 130 may be formed in the lower wire 110 in the extension direction of the via hole 230a, that is, in the direction in which the via hole 230a extends.

The upper surface of the lower wire 110 may have a profile that contacts the lower surface of the via hole 230a formed on the lower wire 110 or that partially rises into the via hole 230a.

Although the interlayer insulating film 200 formed on the lower wire 110 and having the via hole may be a single film, it may have a layered structure comprising a plurality of insulating films 210, 220, as shown in FIG. 1. In addition, a trench 230b, which is connected to the via hole 230a to form an upper wire, may be provided in the interlayer insulating film 220 formed on the via hole 230a. The interlayer insulating film 200 may be formed with silicon oxide (SiO$_x$), PE-TEOS (Plasma Enhanced TetraEthylOrtho Silicate), PEOX (Plasma Enhanced Oxide), FSG (Fluoride Silicate Glass), PSG (Phosphor Silicate Glass), BPSG (BoroPhosphoSilica Glass), USG (Undoped Silica Glass), SiOC(H), or layered films thereof.

Further, the predetermined etching stop layers 105, 215 may be interposed between the interlayer insulating films. Such etching stop layers 105, 215 may be formed to a thickness of about 200~1000 Å using SiN, SiC, SiON, SiCN, etc. However, the etching stop layer may not be provided between the interlayer insulating films as long as this does not inhibit the purpose of the present invention, if necessary.

The diffusion barrier 240 preventing the diffusion of conductive material, for example, copper or a copper alloy, is formed on the inner wall of the via hole 230a and the inner wall of the trench 230b. Examples of material for the diffusion barrier 240 include, but are not limited to, TiN, Ti, Ta, TaN, TiSiN, and TaSiN. The diffusion barrier 240 may be formed to a thickness of about 10~500 Å.

The via hole 230a and the trench 230b, having the diffusion barrier 240, are filled with conductive material such as copper or a copper alloy, thus forming the upper wire 230. As such, the upper wire 230 may be directly connected to the lower wire 110. That is, no film, such as a diffusion barrier, is interposed between the lower wire 110 and the upper wire 230, thus the lower wire and the upper wire may be in direct contact with each other. Therefore, deterioration of resistance by the diffusion barrier, which has conventionally been considered problematic, may be overcome, and the resistance properties of the semiconductor device may thus be improved.

Referring to FIGS. 2 to 6, the method of fabricating the semiconductor device shown in FIG. 1 is described. Below, predetermined processes, which may be implemented using process steps well known to those skilled in the art, are described to avoid ambiguity in the present invention. In addition, the redundant description of sizes, shapes, materials, etc., of structural constituents of the device mentioned above is omitted, or is briefly described.

FIGS. 2 to 6 are cross-sectional views illustrating the process of fabricating the semiconductor device of the present invention. The method of fabricating the semiconductor device of the present invention is described with reference to a dual damascene process. Alternatively, it is to be understood that a single damascene process may be applied to the present invention.

Figure 2:
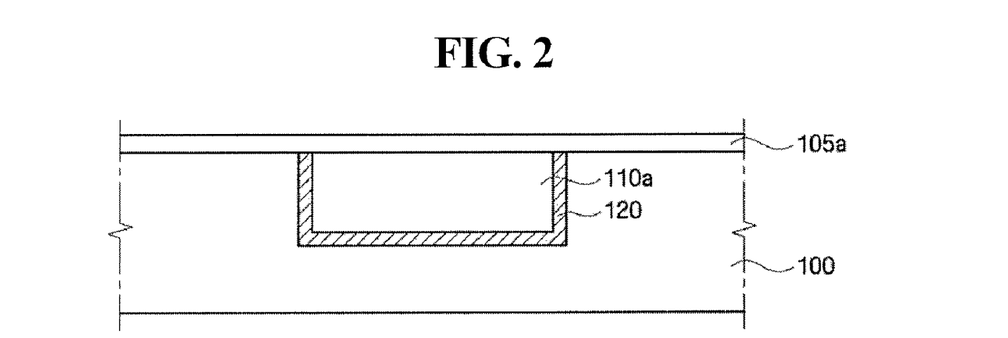
FIGS. 2 to 6 are cross-sectional views showing the process of fabricating the semiconductor device shown in FIG. 1, according to the present invention.

As shown in FIG. 2, a lower wire 110a is formed on a semiconductor substrate (not shown) having predetermined fine elements. The lower wire 110a is formed of copper or a copper alloy, but the present invention is not limited thereto. In addition, the lower wire may be formed in a predetermined interlayer insulating film 100 through the damascene process.

On the lower wire 110a, an etching stop layer 105a may be formed. Such an etching stop layer 105a functions to minimize deterioration of the lower wire 110a in subsequent procedures, to increase the accuracy of the etching process, and to prevent the diffusion of metal wire material such as copper.

Figure 3:
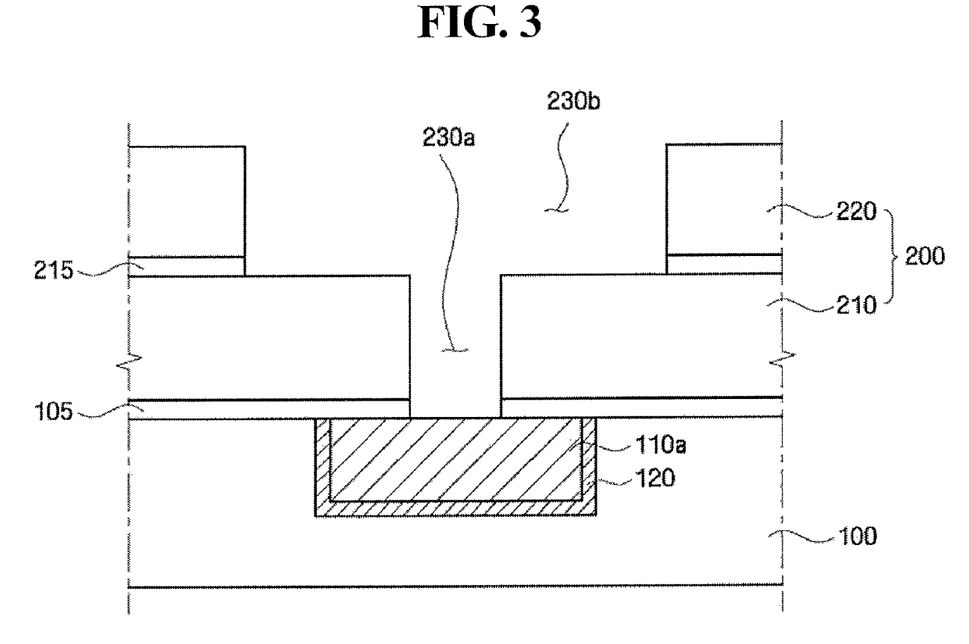

As shown in FIG. 3, an interlayer insulating film 200 having a via hole 230a is formed on the lower wire 110. The interlayer insulating film 200 may be a single film or may have a layered structure comprising a plurality of films. In addition, a predetermined trench 230b may be further formed on the via hole 230a, and a predetermined etching stop layer 215 may be interposed between the interlayer insulating films. As such, the interlayer insulating film and the etching stop layer may be mainly formed using CVD (Chemical Vapor Deposition), but the present invention is not limited thereto. However, such an etching stop layer 215 may not be interposed between the interlayer insulating films within a range that does not the purpose of the present invention, if necessary.

Figure 4:
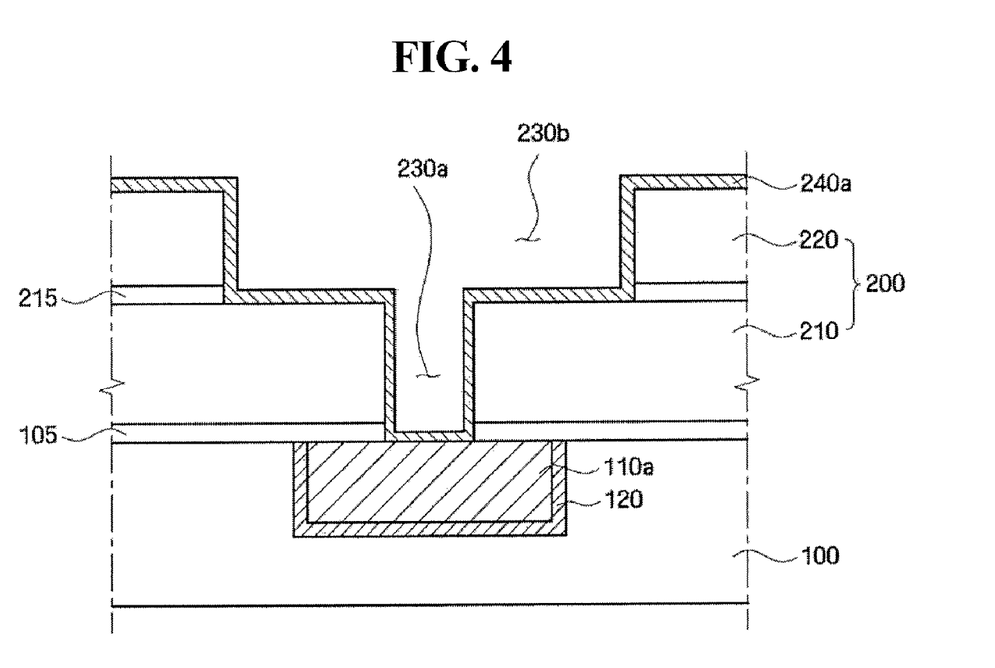

As shown in FIG. 4, a diffusion barrier 240a is formed on the inner wall and lower surface of the via hole 230a and the inner wall of the trench 230b.

Examples of the material for the diffusion barrier 240a include, but are not limited to, conductive materials, such as TiN, Ti, Ta, TaN, TiSiN, and TaSiN. The diffusion barrier 240a may be formed through PVD, ALD, or MOCVD. For instance, in the case of forming the diffusion barrier 240a through PVD, it may be formed to be thinner on the inner wall and lower surface of the via hole 230a relative to the top of the interlayer insulating film 220 or the inner wall of the trench 230b, as shown in FIG. 4.

Such a diffusion barrier 240 may be formed to a thickness of about 10~500 Å. As such, when the diffusion barrier formed on the lower surface of the via hole 230a has a thickness of about 100 Å or less, it may be desirably inverted with the lower wire through heat treatment as described below.

Figure 5:
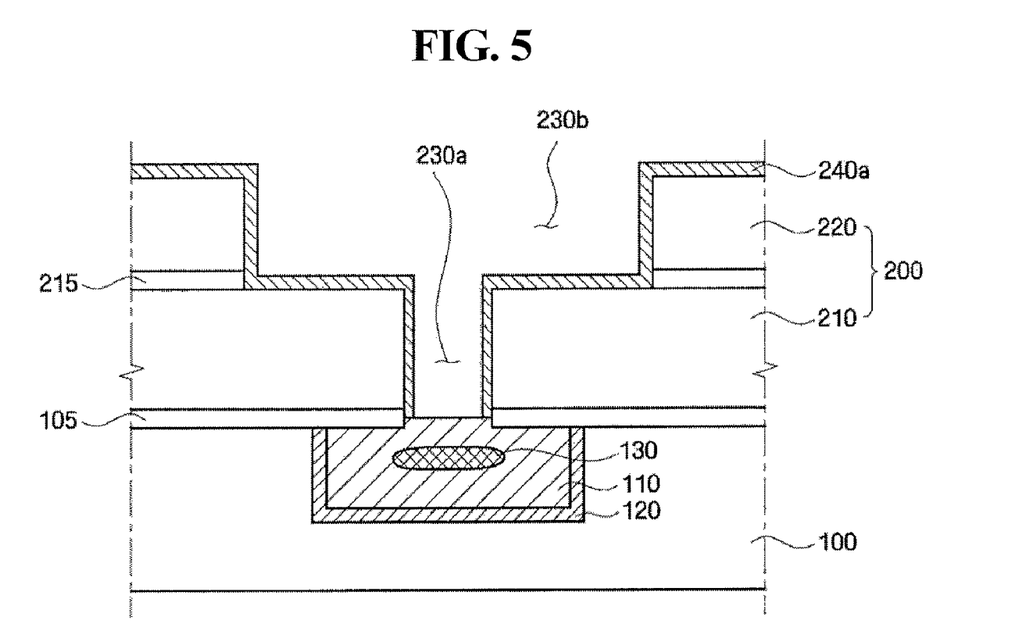

Thereafter, the structure of FIG. 4 is heat treated. Through such heat treatment, a dopant region 130 is formed in the lower wire 110 as shown in FIG. 5.

The dopant region 130 results from inversion of the components of the diffusion barrier 240 and the lower wire through heat treatment. Specifically, the heat treatment functions such that the diffusion barrier 240, which is formed on the lower surface of the via hole 230a and thus contacts the lower wire 110, diffuses in the lower wire 110, whereas the lower wire 110 diffuses toward the via hole 230a. Thereby, in the lower wire 110, the component of the diffusion barrier may form an intermetallic compound with the component of the lower wire, or may cause boundary segregation. As a result, the dopant region 130 containing the component of the diffusion barrier is formed in the lower wire 110 in the extension direction of the via hole 230a. Hence, the diffusion barrier is removed from the lower surface of the via hole 230a, such that the lower wire 110 may be exposed again through the via hole 230a. The upper surface of the lower wire 110 may have a profile contacting the lower surface of the via hole 230a or rising into the via hole 230a.

In such a case, the heat treatment process may be appropriately conducted at about 400~700° C. in consideration of thermal budget. In addition, the heat treatment process may be carried out through RTP (Rapid Thermal Processing). In RTP, various factors (e.g. temperature, pressure, etc.) of the heat treatment environment may be readily controlled, leading to a heat treatment effect superior to that of a furnace process. In addition, the heat treatment process may be based on a typical furnace process. The furnace process enables the maintenance of the inside of a chamber in a thermal equilibrium state, and thus, it is easy to maintain the same temperature-time properties even though the semiconductor substrate is repeatedly replaced. In this way, the type of process and the temperature and time period required therefor may be set within a range that does not inhibit the purpose of the present invention.

Figure 6:
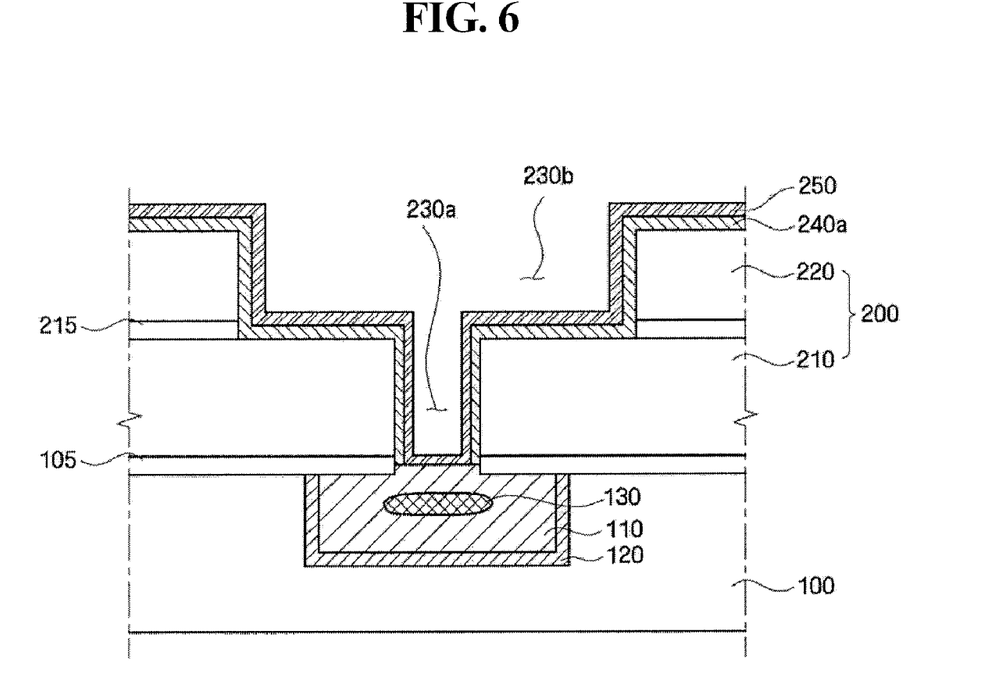

Subsequently, an upper wire is formed.

To this end, as shown in FIG. 6, a seed layer 250 is formed on the inner walls of the via hole and of the trench. The seed layer 250 is formed by depositing copper through PVD to have a thickness of about 100~2000 Å.

The via hole 230a and the trench 230b are filled with the conductive material through electroplating. Then, a flattening process is conducted through CMP in order to expose the upper surface of the interlayer insulating film 200, thus completing the upper wire 230 shown in FIG. 1. Since the seed layer 250 is integrated with the upper wire 230, it is not shown in FIG. 1 for clarity.

Thereafter, the semiconductor device may be completed through subsequent procedures well known in the art.

Figure 7A:
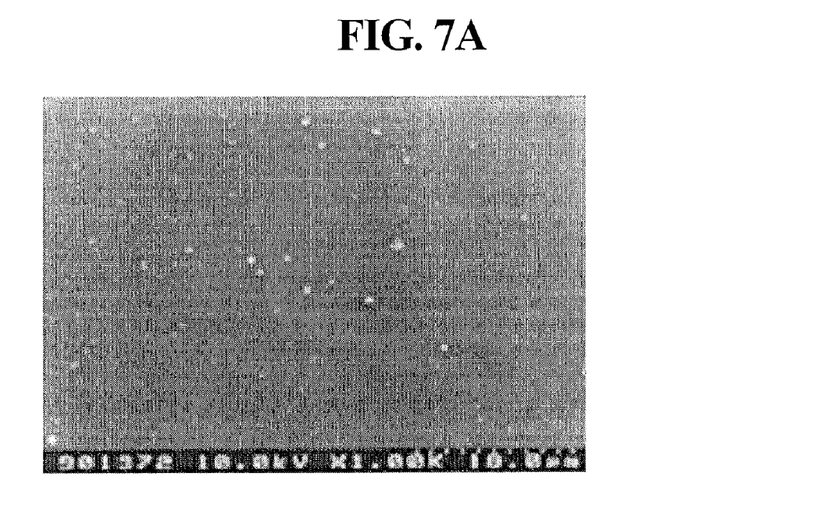
FIGS. 7A and 7B are scanning electron micrographs (SEMs) showing the state of the lower surface of the via hole according to the fabrication process of the present invention.
Figure 7B:
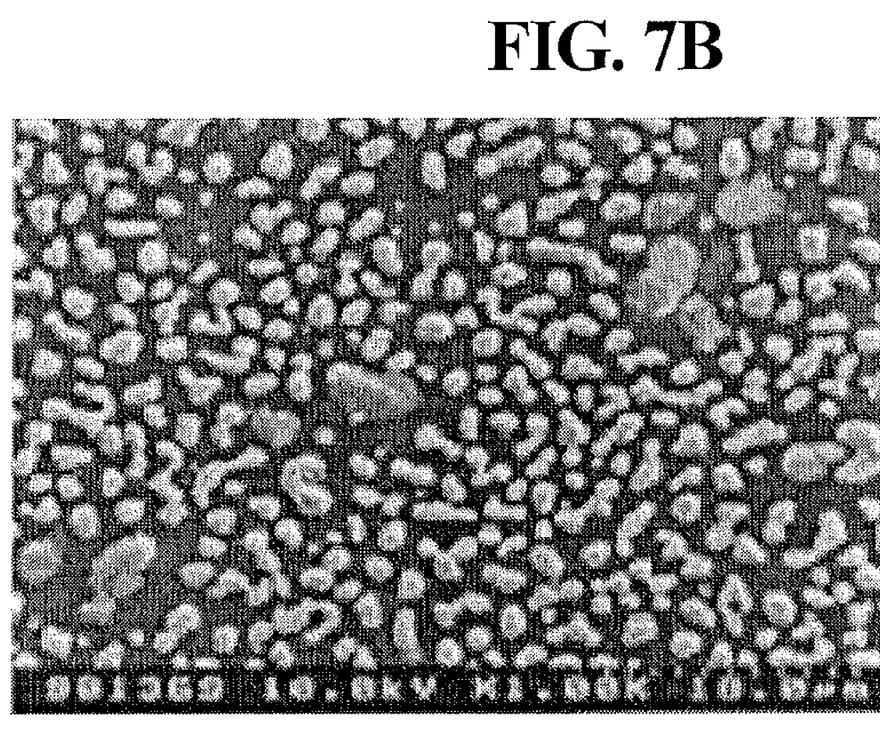

Turning now to FIGS. 7A and 7B, shown are SEMs of the semiconductor device according to the fabrication process of the present invention.

FIG. 7A is an SEM showing the surface of the product of FIG. 4. Specifically, the lower surface of the via hole having the diffusion barrier is shown. From FIG. 7A, the above surface can be seen to be covered with the diffusion barrier.

FIG. 7B shows the lower surface of the via hole in the product of FIG. 5 after heat treatment of the product of FIG. 4. Specifically, the lower surface of the via hole, which is subjected to annealing at 400° C. within 1 min through RTP, is shown. From FIG. 7B, it can be shown that the lower copper wire layer is exposed from the lower surface of the via hole, through the inversion of the diffusion barrier and the copper layer. In FIG. 7B, the light portions indicate the copper component.

As described hereinbefore, the present invention provides a semiconductor device and a method of fabricating such a semiconductor device. According to the semiconductor device of the present invention and the fabrication method thereof, the following effects may be expected. That is, first, a diffusion barrier is not interposed between the lower wire and the upper wire, thereby decreasing the resistivity of a copper wire. Second, the generation of SIV may be minimized, thus increasing the reliability of the wire of the semiconductor device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of fabricating a semiconductor device, comprising:
    forming a lower wire;
    forming an interlayer insulating film having a via hole exposing an upper surface of the lower wire;
    forming a diffusion barrier on an inner wall of the via hole and a lower surface thereof;
    inverting the diffusion barrier formed on the lower surface of the via hole with the lower wire adjacent thereto through heat treatment, thus forming a dopant region containing a component of the diffusion barrier in the lower wire; and
    forming an upper wire filling the via hole and directly contacting the lower wire.

2. The method of claim 1, wherein the lower wire and the upper wire are formed of copper or a copper alloy.

3. The method of claim 1, wherein forming the diffusion barrier is conducted using TiN, Ti, Ta, TaN, TiSiN, or TaSiN.

4. The method of claim 1, wherein forming the diffusion barrier is conducted to have a thickness of 10~500 Å.

5. The method of claim 4, wherein forming the diffusion barrier is conducted such that the diffusion barrier has a thickness of 100 Å or less on the lower surface of the via hole.

6. The method of claim 1, wherein the heat treatment process is conducted at 400~700° C.

7. The method of claim 1, wherein the heat treatment process is conducted using rapid thermal processing or a furnace process.

8. The method of claim 1, wherein the filling the via hole comprises:
   forming a copper seed layer on the diffusion barrier formed on the inner wall of the via hole, and
   forming a copper layer through electroplating.

9. The method of claim 1, wherein forming the interlayer insulating film further comprises forming a trench on the via hole,
   forming the diffusion barrier is conducted while forming the diffusion barrier on an inner wall of the trench, and
   filling the via hole is conducted while filling the trench.

10. The method of claim 1, wherein the heat treatment process comprises exposing an upper surface of the lower wire through the via hole such that the upper surface of the lower wire has a profile contacting the lower surface of the via hole or rising into the via hole.

* * * * *